(12) United States Patent
Noh

(10) Patent No.: US 7,544,560 B2
(45) Date of Patent: Jun. 9, 2009

(54) IMAGE SENSOR AND FABRICATION METHOD THEREOF

(75) Inventor: Hyun-Pil Noh, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 299 days.

(21) Appl. No.: 11/502,445

(22) Filed: Aug. 11, 2006

(65) Prior Publication Data

US 2007/0037312 A1 Feb. 15, 2007

(30) Foreign Application Priority Data

Aug. 12, 2005 (KR) ............... 10-2005-0074445

(51) Int. Cl.
*H01L 21/8238* (2006.01)
(52) U.S. Cl. ............... 438/221; 438/296; 257/E21.63
(58) Field of Classification Search ............ 438/48–50, 438/54, 221, 296, 353; 257/414, 421–422, 257/374, 510
See application file for complete search history.

(56) References Cited

U.S. PATENT DOCUMENTS 6,372,603 B1 4/2002 Yaung et al.
7,358,108 B2 * 4/2008 Han et al. ............... 438/60
2005/0176167 A1 * 8/2005 Lee ............... 438/60
2005/0179072 A1 * 8/2005 Rhodes ............... 257/291
2006/0131624 A1 * 6/2006 Katsuno et al. ............ 257/292

FOREIGN PATENT DOCUMENTS

| JP | 05-190825 | 7/1993 |
| KR | 1020030001795 A | 1/2003 |
| KR | 10-2003-056323 | 7/2003 |
| KR | 10-2003-056324 | 7/2003 |
| KR | 1020030056324 A | 7/2003 |

OTHER PUBLICATIONS

Office Action for corresponding Korean Application No. 10-2005-074445 dated Sep. 30, 2006.

* cited by examiner

*Primary Examiner*—Phat X Cao
*Assistant Examiner*—Nga Doan
(74) *Attorney, Agent, or Firm*—Harness Dickey & Pierce

(57) ABSTRACT

Example embodiments relate to an image sensor and a fabrication method thereof, capable of reducing dark current and a fabrication method thereof. The image sensor may include a semiconductor substrate including an active region defined by an isolation layer, a photoelectric-conversion region and a charge-movement-prevention region formed at an interface between the photoelectric-conversion region and the isolation layer.

11 Claims, 5 Drawing Sheets

IMAGE SENSOR AND FABRICATION METHOD THEREOF

PRIORITY STATEMENT

This application claims priority under 35 U.S.C. § 119 to Korean Patent Application No. 10-2005-0074445, filed on Aug. 12, 2005, in the Korean Intellectual Property Office (KIPO), the entire contents of which are incorporated herein by reference.

BACKGROUND

1. Field

Example embodiments relate to an image sensor and a fabrication method thereof. Other example embodiments relate to an image sensor capable of reducing dark current and a fabrication method thereof.

2. Description of the Related Art

An image sensor is a semiconductor device that converts an optical image into an electrical signal. Image sensors may be classified into charge coupled devices (CCD) and complementary metal-oxide semiconductor (CMOS) image sensors. A CCD refers to a device in which the MOS capacitors are more closely arrayed and charge may be stored in a capacitor. A CMOS image sensor refers to a device which uses a switching method. A CMOS image sensor may have the same amount of MOS transistors as pixels and a control circuit. The CMOS image sensor also may have a signal processing circuit that is used as a peripheral circuit and the output may be sequentially detected by the MOS transistor. The CMOS image sensor may include a photodiode that receives light into a unit pixel and CMOS may block controlling image signals from the photodiode.

A trench-type field insulation layer may be formed in a CMOS image sensor in order to isolate actives and fields. An interface between a field insulation layer and an active region may be damaged during the formation of the field irysulation layer. The damage to the interface may generate a hole carrier, thereby increasing a leakage current of a photodiode. This leakage current may move into the floating diffusion region from the photodiode and this current is called dark current.

SUMMARY

Example embodiments relate to an image sensor and a fabrication method thereof. Other example embodiments relate to an image sensor capable of reducing dark current and a fabrication method thereof.

According to example embodiments, an image sensor may include a semiconductor substrate including an active region defined by an isolation layer, a photoelectric-conversion region and/or a charge-movement-prevention region. A photoelectric-conversion region may be formed on an active region between the isolation layer and a charge-detection region. The charge-movement-prevention region may be made of impurities and may be formed on an interface between the photoelectric-conversion region and the isolation layer to reduce or prevent the dark current.

According to other example embodiments, a method of fabricating the image sensor may include forming a trench in a semiconductor substrate, depositing an insulation layer including impurities along the trench, forming a charge-movement-prevention region by spreading the impurities included in the insulation layer by a thermal process on the semiconductor substrate around the trench, removing an insulation layer including the impurities, and completing an isolation layer composed of an undoped insulation material in the trench.

BRIEF DESCRIPTION OF THE DRAWINGS

Example embodiments will be more clearly understood from the following detailed description taken in conjunction with the accompanying drawings.

FIG. 1 is a circuit diagram illustrating a unit pixel of an image sensor according to example embodiments;

FIG. 2 is a diagram illustrating a unit pixel of an image sensor according to example embodiments;

FIG. 3 is a diagram illustrating a unit pixel of an image sensor cut according to III-III' in FIG. 2 according to example embodiments.

DETAILED DESCRIPTION OF EXAMPLE EMBODIMENTS

Figure 1:
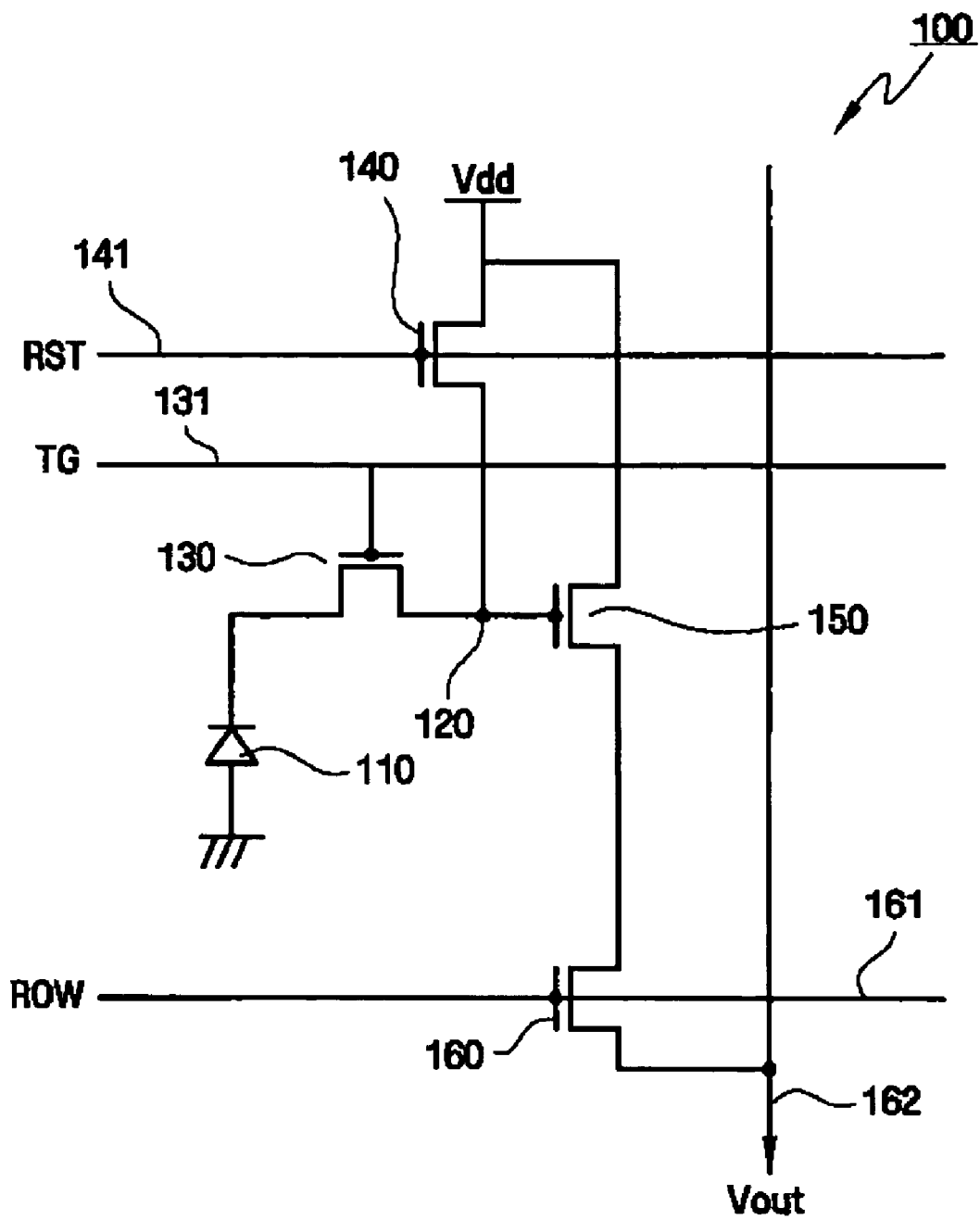
FIGS. 1-3 represent non-limiting, example embodiments as described herein.

Example embodiments may be understood more readily by reference to the following detailed description and the accompanying drawings. Example embodiments may be embodied in many different forms and should not be construed as being limited to the embodiments set forth herein. Rather, these embodiments are provided so that this disclosure will be complete and will fully convey the concept of example embodiments to those skilled in the art and example embodiments will be defined by the appended claims. Like reference numerals refer to like elements throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90° or at other orientations) and the spatially relative descriptors used herein interpreted accordingly.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments relate to an image sensor and a fabrication method thereof. Other example embodiments relate to an image sensor capable of reducing dark current and a fabrication method thereof.

Figure 2:
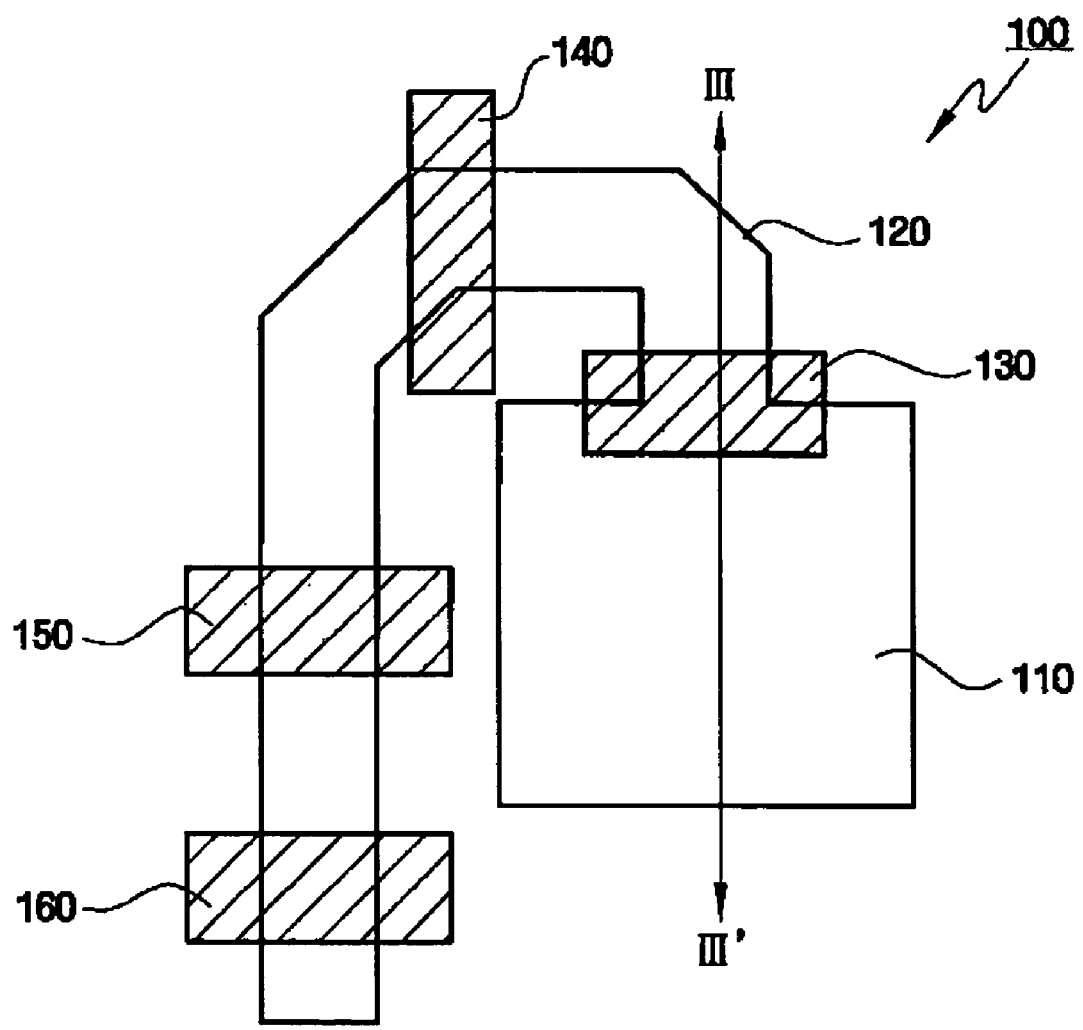

Hereinafter, a structure of an image sensor according to example embodiments will be described in detail with reference to FIGS. 1 to 3. The image sensor will be described as a CMOS image sensor. However, the technical concept of the example embodiments may be applied to a CCD. FIG. 1 is a circuit diagram illustrating a unit pixel of an image sensor according to example embodiments. FIG. 2 is a diagram illustrating a unit pixel of an image sensor according to example embodiments.

As illustrated in FIG. 1 and FIG. 2, the unit pixel 100 of an image sensor, according to example embodiments, may include a photoelectric-conversion region 110, a charge-detection region 120, a charge-transmission structure 130, a reset structure 140, an amplification structure 150, and a selection structure 160. In example embodiments, a unit pixel 100 may have 4 transistors, as illustrated in FIG. 1, but may also have 5 transistors or another number of transistors. The photoelectric-conversion region 110 may create and accumulate charge corresponding to incident light. The photoelectric-conversion region 110 may be capable of using a mixture of a photodiode, a photo transistor, a photo gate, and a pinned photodiode (PPD).

A floating diffusion region (FD) may be used in the charge-detection region 120 and the charge that accumulates in the photoelectric-conversion region 110 may be transmitted thereto. Because the charge-detection region 120 has a parasitic capacitance, the charge may be accumulatively stored. The charge-detection region 120 may be electrically connected to a gate and may control the amplification structure 150. The charge-transmission structure 130 may transmit the charge from the photoelectric-conversion region 110 to the charge-detection region 120. The charge-transmission structure 130 may include a single transistor and may be controlled by a charge-transmitting signal (TG). The reset structure 140 may periodically reset the charge-detection region 120. The source of the reset structure 140 may be connected to the charge-detection region 120 and a drain may be connected to Vdd. The reset structure 140 may be driven in response to reset signals.

The amplification structure 150 may function as a source-follower buffer amplifier, mixed with a constant current source (not shown) located outside the unit pixel 100 and a voltage that varies in response to the voltage in the charge-detection region 120 that is output to a vertical signal line 162. The source may be connected to a drain of the selecting structure 160 and the drain may be connected to Vdd. The selecting structure 160 may select a unit pixel 100 read in rows of units. The selecting structure 160 may be operated in response to a selection signal (ROW) and the source may be connected to the vertical signal line 162. The charge-transmission structure 130, the reset structure 140 and operating signal lines 131, 141, and 161 of the selecting structure 160 may be extended in a row (horizontal direction) so that the unit pixels in the same row may be simultaneously operated.

Figure 3:
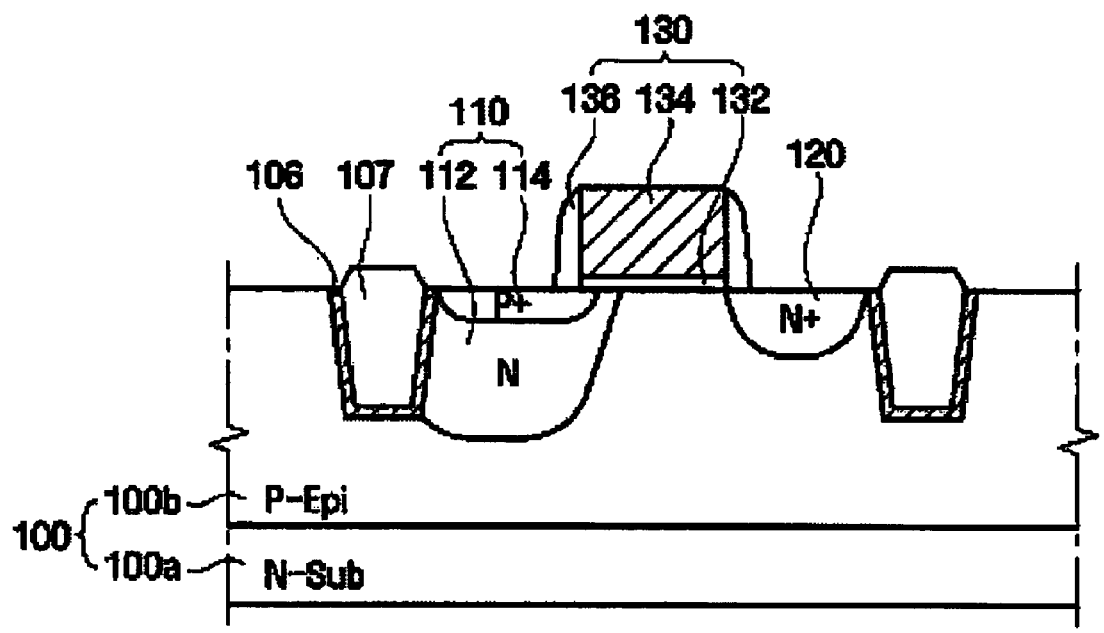

FIG. 3 is a diagram illustrating a unit pixel in an image sensor according to example embodiments, cut according to III-III' in FIG. 2. As illustrated in FIG. 3, an image sensor according to example embodiments may include a semiconductor substrate 100, a charge-movement-prevention region 106, an isolation layer 107, a photoelectric-conversion region 110, a charge-detection region 120, and/or a charge-transmission structure 130. Example embodiments are described using a pinned photodiode (PPD) as a photoelectric-conversion region 110.

An epitaxial substrate, wherein a P type epi layer 100B is attached to an N type substrate 100A, may be used as a semiconductor substrate 100. The isolation layer 107 may be formed in the semiconductor substrate 100 defining an active region. The isolation layer 107 may be formed by a shallow trench isolation (STI) process and using an undoped insulation material. For example, the isolation layer 107 may be formed to use high density plasma (HDP). The charge-movement-prevention region 106 may be located at an interface between the isolation layer 107 and the semiconductor substrate 100 and/or between the isolation layer 107 and the photoelectric-conversion region 110. The charge-movement-prevention region 106 may reduce or prevent dark current by moving the charge generated by damage to a side wall when the isolation layer 107 is formed on a photodiode 112 of the photoelectric-conversion region 110. The photoelectric-conversion region may be located in one side of the isolation layer 107.

The charge-movement-prevention region 106 may be formed with impurities opposite to those of the photodiode 112. For example, p-type impurities may be formed in the charge-movement-prevention region in case of an n-type photodiode 112. The photoelectric-conversion region 110 formed in the semiconductor substrate 100 may include the n-type photodiode 112, a P+ pinning layer 114 and a p-type epi layer 100B in a lower part of the photodiode 112.

The charge generated by the incident light may be accumulated in the photodiode 112 and the pinning layer 114 may retard or prevent dark current by reducing the thermal creation of an electron-hole pair(EHP) on a p-type epi layer 100B. The surface damage of a photodiode may be one of the causes of dark current in an image sensor. The surface damage may be caused by the formation of dangling silicon bonds and/or defects associated with an etching stress created in the process of manufacturing a gate. By forming the photodiode 112 more deeply in the p-type epi layer 100B and the p+ pinning layer 114, a positive charge diffuses through a p+ pinning layer 114 to a grounded substrate. A negative charge may be damaged by re-combining the positive holes during the process of spreading the pinning layer 114 among the EHP's thermally generated on the surface of the p-epi layer 100B.

The charge-detection region 120 may be formed in a semiconductor substrate 100 and the charge that has accumulated in the photoelectric-conversion region 110 may be transmitted thereto via the charge-transmission structure 130. The charge-detection region 120 may be formed by doping n-impurities. The charge-transmission structure 130 may include a gate insulation layer 132, a gate electrode 134, and a spacer 136.

A gate-insulation layer 132 may be formed by $SiO_2$, SiON, SiN, $Al_2O_3$, $Si_3N_4$, GexOyNz, GexSiyOz and/or any compound with a relatively high dielectric constant. The relatively high dielectric constant material may be $HfO_2$, $ZrO_2$, $Al_2O_3$, $Ta_2O_5$, hafnium silicate, zirconium silicate and/or a combination layer of the materials created by using atomic layer deposition (ALD). The gate insulation layer 132 may be formed by stacking two or more materials of the aforementioned materials into a plurality of layers. A gate insulation layer 132 may be formed to a thickness of about 5 Å to about 100 Å.

The gate electrode 134 may be formed by a metal silicide layer obtained from a conductive polysilicon layer, a metal layer (e.g., W, Pt and/or Al), a metal nitride layer (e.g., TiN) or a refractory metal (e.g., Co, Ni, Ti, Hf, Pt and/or a combination layer of the materials). The gate electrode 134 may be formed by sequentially stacking a conductive polysilicon layer and a metal silicide layer, or a conductive polysilicon layer and a metal layer, but it is not limited thereto. The spacer 136 may be formed on both side walls of the gate electrode 134 and may be formed of silicon nitride (SiN).

Hereinafter, a method of fabricating an image sensor according to example embodiments will be described with reference to FIGS. 3-9. FIGS. 3-9 sequentially illustrate a method of fabricating an image sensor according to example embodiments.

Figure 4:
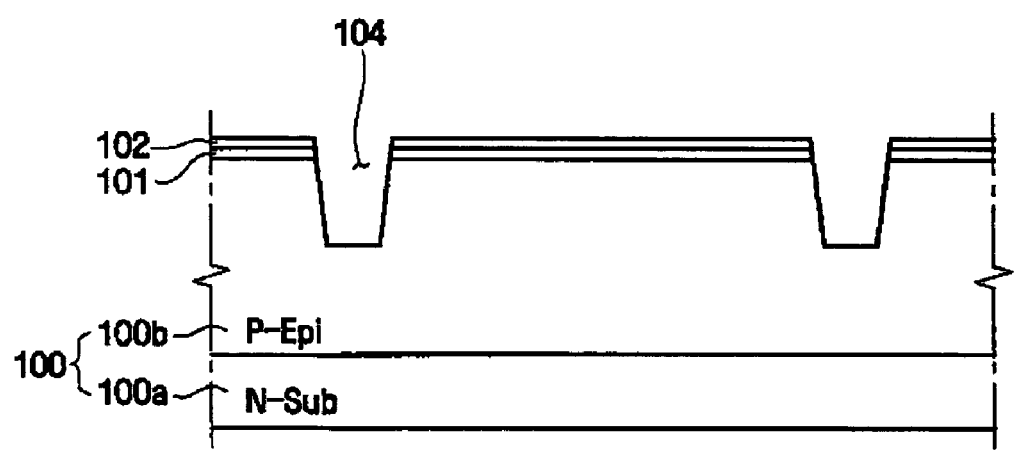
FIG. 4-FIG. 9 are diagrams illustrating a method of fabricating an image sensor according to example embodiments.

As illustrated in FIG. 4, an oxide and a nitride may be sequentially stacked on a semiconductor substrate 100 and a photosensitive pattern (not shown) may be formed thereon. An oxide pattern 101 and a nitride pattern 102 may be formed by sequentially etching the oxide and the nitride. A trench 104 may be formed in order to produce an isolation layer 107 using the oxide pattern 101 and the nitride pattern 102 as an etching mask and etching the semiconductor substrate 100 using an anisotropic dry etching technique. Considering etching characteristics and a gap fill to be progressed afterwards, a side wall profile of the trench 104 may be formed in a way that has a positive tilt, where the width of a lower part tapers.

Once a trench 104 has been formed, a thermal oxide layer (not shown) may be formed by performing a thermal oxidation process on the surface of the trench 104. The thermal oxidation process may be performed, with the surface of the trench 104 exposed, by a dry oxidation method using $O_2$ or by a wet oxidation method using $H_2O$. The thermal oxide layer (not shown) may reduce defects or damage of the side wall generated by the dry etching process when forming the trench 104.

Figure 5:
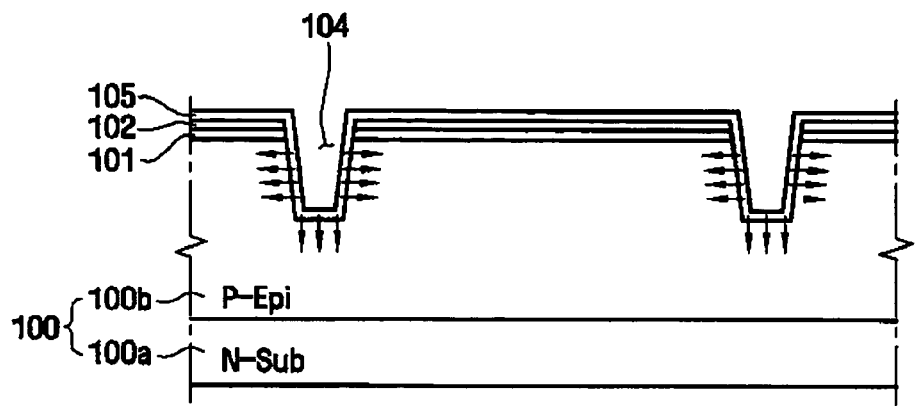

As illustrated in FIG. 5, an insulation layer 105 containing p-type impurities may be conformably formed along a trench 104. The insulation layer 105 may be formed by using a deposition method (e.g., chemical vapor deposition (CVD)), wherein boron silicate glass (BSG) may be used as an insulation layer. The insulation layer 105 containing the p-type impurities may be formed to a thickness of about 300 Å to about 700 Å. A boron (B) ion may be used as the p-type impurities of the insulation layer 105, which may have impurities density of about $1\times10^{14}$-about $1\times10^{17}$ atoms/cm$^3$.

Figure 6:
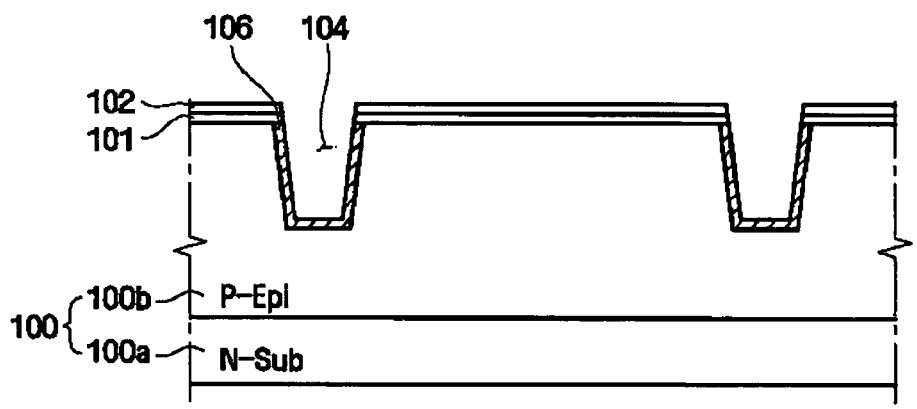

The p-type impurities of the insulation layer 105 may diffuse into the semiconductor substrate 100 around the periphery of the trench 104 during a thermal process. The thermal process may be carried out for about 20-about 100 minutes at a temperature of about 700° C. to about 900° C. As illustrated in FIG. 6, a charge-movement-prevention region 106 including p-type impurities may be formed on a semiconductor substrate 100 around the periphery of a trench 104. A constant diffusion of p-type impurities caused by a thermal effect according to a subsequent process may be retarded or prevented by forming the charge-movement-prevention region 106 and removing the insulation layer 105 including the p-type impurities.

Once the charge-movement-prevention region 106 has been formed in the semiconductor substrate 100, the insulation layer 105 including the p-type impurities may be removed by a wet etching method. A liner (not shown) may be formed of a nitride along the surface of a trench 104. Once the liner (not shown) has been formed, a radical oxidation process with respect to the liner (not shown) may be carried out. The radical oxidation process reduces damage to an interface between an active region of the semiconductor substrate 100 and an isolation layer 107 and/or an interface between the charge-movement-prevention region 106 and the device separation layer 107 when removing an oxide pattern 101 and a nitride pattern 102 in the subsequent process.

Figure 7:
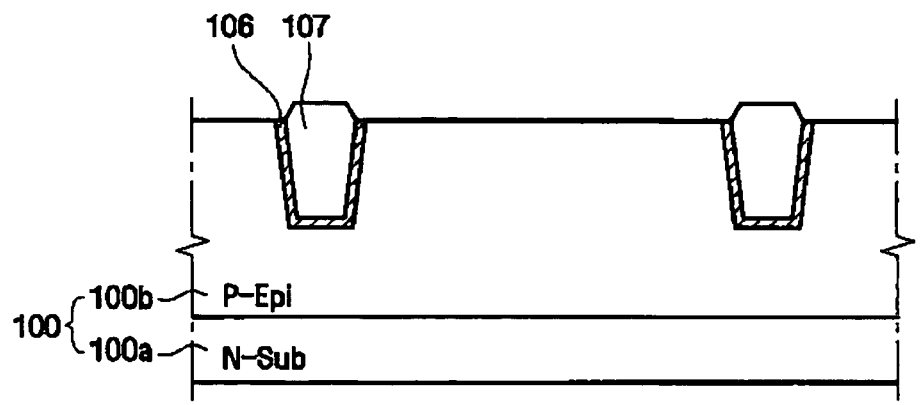

An undoped insulation material may be deposited to fill the trench 104. An HDP oxide layer may be used as an insulation material. Subsequently, the HDP oxide layer may be planarized by a process (e.g., chemical mechanical polishing (CMP)) until the nitride pattern 102 is exposed. If the oxide pattern 101 and the nitride pattern 102 are removed using an etching solution containing phosphoric acid and hydrofluoric acid (HF), the isolation layer 107 formed with an undoped insulation material may be completed, as illustrated in FIG. 7. The completed isolation layer 107 may define an active region of the semiconductor substrate 100.

Figure 8:
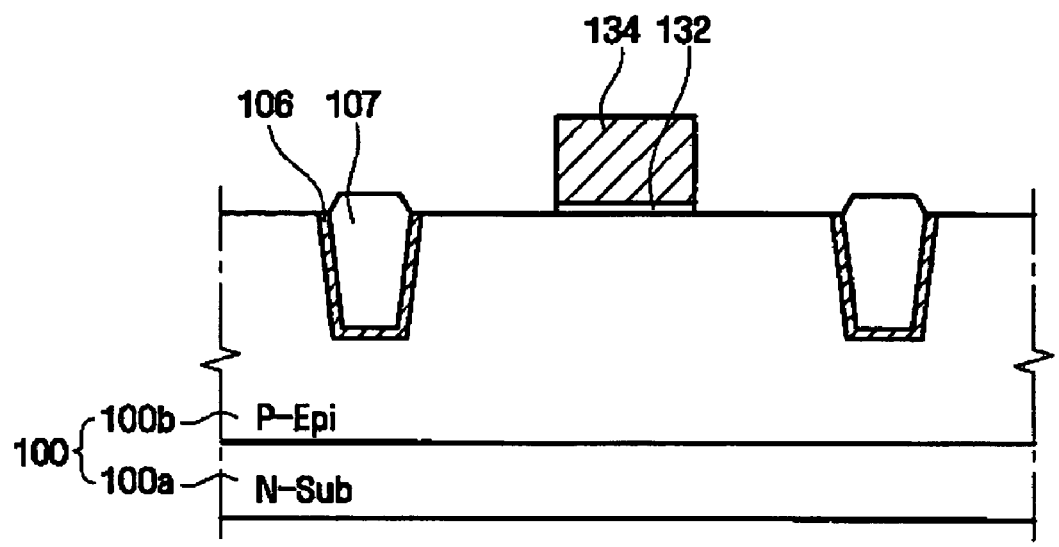

As illustrated in FIG. 8, an insulation layer and a conductive film for a transmission-gate electrode may be sequentially deposited on the active region of the semiconductor substrate 100. The insulation layer may be formed of silicon oxide, and the conductive film for the gate electrode may be a doped polysilicon layer. A gate electrode 134 and a gate insulation layer 132 may be formed by patterning a conductive film of the gate electrode and the insulation layer.

Figure 9:
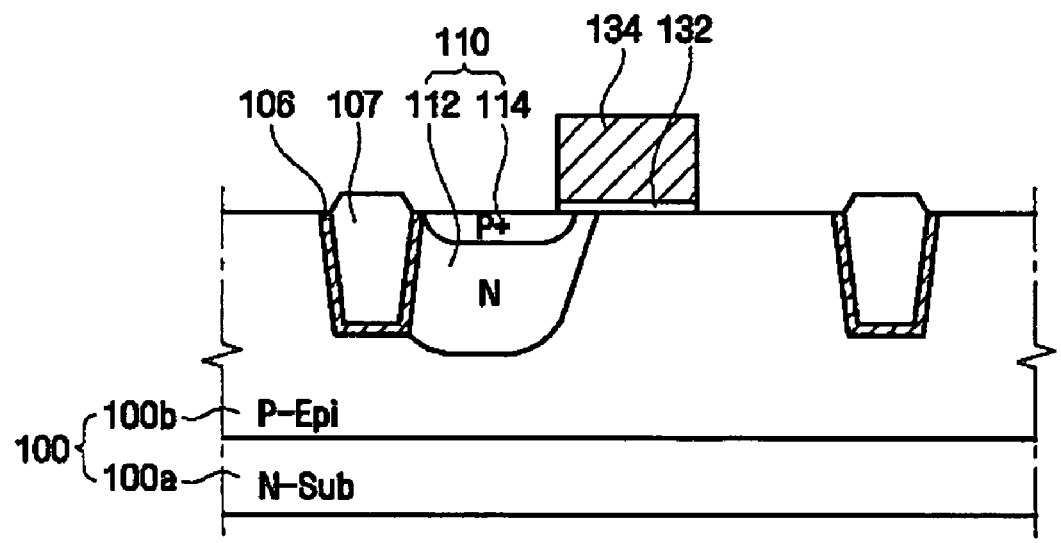

An n-type photodiode 112, as illustrated in FIG. 9, may be formed by ion-implanting n-type impurities deeper than a charge-detection region (see 120 in FIG. 3). When ion-planted, the n-type impurities may be obliquely formed at an angle of about 0° to about 15°. The photodiode 112 may overlap with some parts of the gate electrode 134. Once an N photodiode 112 has been formed, a pinning layer 114 may be formed by implanting a relatively large quantity of p-type impurities at a lower energy and a higher quantity of doze. The pinning layer 114 may be formed by also implanting ions.

An insulation layer for a spacer, for example, SiN, may be deposited on the semiconductor substrate 100 using CVD and a spacer 136 (shown in FIG. 3) may be etched-back and formed on both sides of a gate insulation layer 132 and a transmission gate electrode 134. The spacer 136 may then be formed on the photoelectric-conversion region 110 and the charge-detection region 120 may be formed, as illustrated in FIG. 3, by using a receptive film as a mask opening region and wherein the gate electrode 134 and the charge-detection region 120 may be formed with a mask and by ion-planting n-type impurities.

According to an image sensor and a fabrication method thereof, dark current of an image sensor may be retarded or prevented by forming a charge-movement-prevention region at an interface between an isolation layer and a photoelectric-conversion region. When an isolation layer is formed, a charge-movement-prevention region may also be formed and an insulation layer containing impurities may be removed. A constant diffusion of the impurities, generated by a thermal effect and according to a subsequent process, may be retarded or prevented by forming an isolation layer of non-doped insulating material.

An additional ion-implanting process may not be necessary when forming a charge-movement-prevention region, therefore, the use of a mask, according to an ion-implanting process, may not be necessary.

As described above in conjunction with example embodiments, the phrase "dark current" may include both dark current and dark current noise. Applying principles of example embodiments, if an interface between a source follower transistor (for example, amplification structure 150) and an STI is doped with p-type impurities, dark current noise of an image sensor may be improved.

It will be understood by those skilled in the art that example embodiments can be implemented in other specific forms without changing the technical spirit or essential features of example embodiments. Therefore, it should be noted that the foregoing embodiments are merely illustrative in all aspects and are not to be construed as limiting the claims.

What is claimed is:

1. A method of fabricating an image sensor comprising:
    forming a trench having a bottom and sidewalls in a semiconductor substrate;
    depositing an insulation layer including impurities along the trench;
    forming a charge-movement-prevention region by spreading the impurities included in the insulation layer by a thermal process through the bottom and sidewalls of the trench to the semiconductor substrate around the trench;
    removing the insulation layer including the impurities; and
    completing an isolation layer composed of an undoped insulation material in the trench.

2. The method of claim 1, wherein the insulation layer is formed to a thickness of about 300 Å to about 700 Å.

3. The method of claim 2, wherein the insulation layer includes a boron silicate glass (BSG).

4. The method of claim 1, wherein the impurities are p-type impurities.

5. The method of claim 4, wherein the p-type impurities are Boron ions.

6. The method of claim 4, wherein the density of the p-type impurities is about $1 \times 10^{14}$ to about $1 \times 10^{17}$ atoms/cm$^3$.

7. The method of claim 1, wherein the thermal process is executed for about 20 to about 100 minutes at the temperature in the range of about 700° C. to about 900° C. when forming the charge-movement-prevention region.

8. The method of claim 1, wherein the insulation layer is removed by a dry etching process when removing the insulation layer.

9. The method of claim 1, further comprising:
    forming a transmission-gate electrode on the semiconductor substrate in which the isolation layer is formed to form a charge-transmission structure; and
    implanting impurities on both sides of the transmission-gate electrode and at an interface between the charge-movement-prevention layer to form a photoelectric-conversion region and a charge-detection region, respectively.

10. The method of claim 9, wherein when forming the photoelectric-conversion region a charge accumulates corresponding to incident light and forms an n-type photodiode overlapping with the transmission gate electrode.

11. The method of claim 10, wherein forming the photoelectric-conversion region includes forming a p-type pinning layer on the photodiode.

* * * * *